United States Patent [19]

Suzuki

[11] Patent Number: 4,710,633

[45] Date of Patent: Dec. 1, 1987

[54] SPECIMEN MOVING DEVICE FOR ELECTRON MICROSCOPE

[75] Inventor: Shigeru Suzuki, Tachikawa, Japan

[73] Assignee: Akashi Seisakusho Ltd., Tokyo, Japan

[21] Appl. No.: 807,858

[22] Filed: Dec. 11, 1985

[30] Foreign Application Priority Data

Feb. 9, 1983 [JP] Japan ................................ 58-160557

[51] Int. Cl.⁴ ................................................ H01J 37/20
[52] U.S. Cl. .................................. 250/442.1; 250/440.1
[58] Field of Search .................... 250/442.1, 440.1, 311

[56] References Cited

U.S. PATENT DOCUMENTS 3,612,863 10/1971 Suzuki ............................. 250/42.41
3,896,314 7/1975 Nukui et al. .................... 250/442.1

Primary Examiner—Carolyn E. Fields
Assistant Examiner—Jack I. Berman
Attorney, Agent, or Firm—Warren B. Kice

[57] ABSTRACT

A specimen moving or manipulating apparatus for an electron beam apparatus which comprises a specimen holder extending slideably in the direction orthogonal to the electron beam axis and mounted on a lens column or barrel defining an electron beam path rotatably relative to the lens column in a plane orthogonal to the electron beam axis, and a lever mounted on the lens column at a position in the vicinity of the distal end of the specimen holder and extending in the direction intersecting the specimen holder, the lever being adapted to move slideably the specimen holder, and a coupling member interposed between the lever member and the specimen holder for rotatable engagement with both of them to thereby operatively coupling together the lever member and the specimen holder. The coupling member has a sharp apex edge and a bottom surface and is so disposed that the apex edge bears against a lateral side of the lever member while the bottom surface is rollingly engaged with the tip end of the specimen holder. The bottom surface of the rolling coupler is curved or rounded in the direction in which the specimen holder is rotated. On the other hand, the associated end face of the specimen holder may be curved or alternatively formed flatly.

3 Claims, 12 Drawing Figures

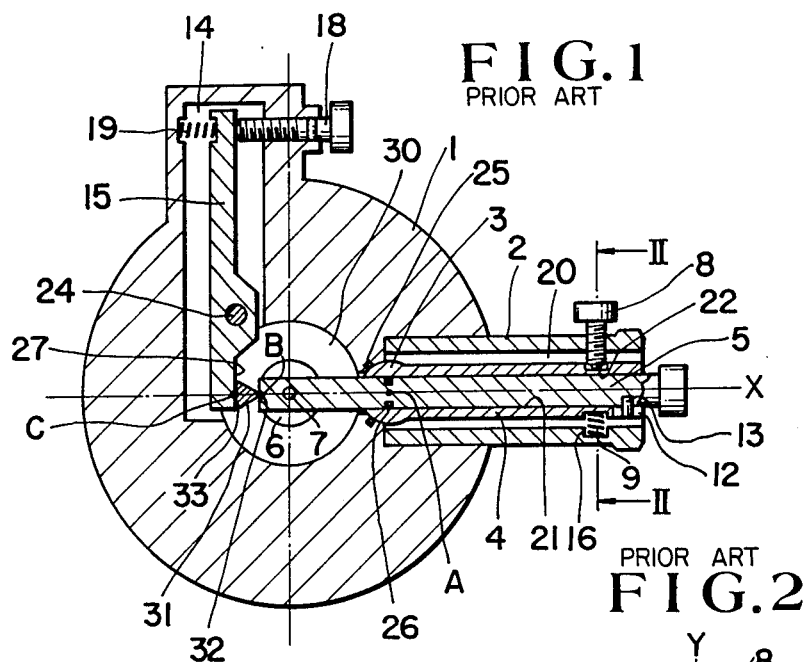
FIG. 1 PRIOR ART
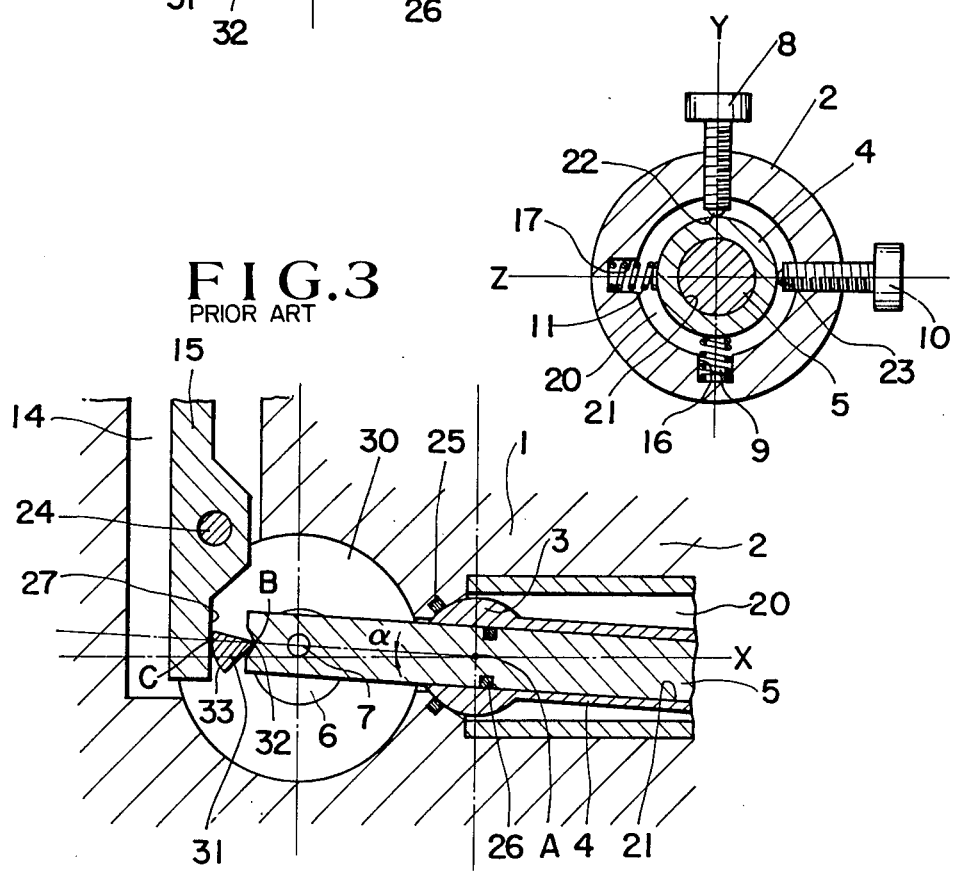
FIG. 2 PRIOR ART
FIG. 3 PRIOR ART

SPECIMEN MOVING DEVICE FOR ELECTRON MICROSCOPE

BACKGROUND OF THE INVENTION

1. Field of the Invention

The present invention relates generally to a specimen moving or manipulating device for an electron beam apparatus. In particular, the present invention concerns a specimen moving apparatus which is capable of moving a specimen disposed on a specimen holder with an improved accuracy while suppressing drifts of the specimen brought about by thermal expansion and contraction of a specimen moving mechanism.

2. Description of the Prior Art

Among electron beam apparatus such as, for example, electron microscopes, there has been known a, one in which a specimen moving device of a so-called side entry type adapted to insert a specimen in the direction perpendicular to the electron beam axis (hereinafter referred to also as optical axis for convenience' sake ) is made use of. A typical specimen moving apparatus of a known structure in which means is provided for protecting the specimen from significant drifts under thermal expansion and contraction of a specimen chamber, objective lens and the specimen moving mechanism brought about by heat generation of the objective lens, variation in the ambient temperature, thermal change of the specimen and the like is illustrated in FIGS. 1 to 5 of the accompanying drawings.

Referring to these figures, a reference numeral 1 denotes a lens column of an electron microscope which defines an electron beam path 30 along the optical axis ( Z-axis ), and a numeral 6 denotes a lower magnetic pole. The lens column 1 and the lower magnetic pole 6 are basic components of the electron microscope. A reference numeral 2 denotes a sleeve-like tilting member having an axial passage 20 and inserted rotatably within a hole formed in the wall of the lens column. The sleeve-like tilting number 2 is so disposed that the axis thereof intersects the optical axis Z. A supporting sleeve 4 provided at a tip end thereof with a spherical portion 3 having a center of rotation A and a bore 21 is disposed rotatably and coaxially within the passage 20. A specimen holder 5 is disposed within the bore 21 of the supporting sleeve 4 so as to be axially movable. The movement or displacement of the specimen holder 5 is restricted by a key 13 anchored in the holder 5 and adapted to engage in a key groove formed in the supporting sleeve 4. The free end portion of the specimen holder 5 ( located on the vacuum side ) is inserted between an upper magnetic pole ( not shown ) and the lower magnetic pole 6. A specimen denoted by a numeral 7 is disposed at a position intersected by the optical axis Z. The supporting sleeve 4 is caused to rotate or swing about the spherical portion 3 by means of a moving or manipulating mechanism composed of an adjusting screw 8 received rotatably in an internally threaded hole formed in the tilting member 2 at a base end portion thereof, a ball 22 and a spring 9 disposed in a recess 16 formed in the tilting member 2 at a position opposite to the screw 8, whereby the specimen 7 is moved horizontally in the direction ( Y-direction ) intersecting orthogonally the axis X of the specimen holder 5 and the optical axis Z.

Further, the supporting sleeve 4 is caused to rotate or pivot about the spherical end portion 3 with the aid of a moving or manipulating mechanism composed of an adjusting screw 10 received rotatably in an internally threaded hole formed in the tilting member 2, a ball 23 and a spring 11 disposed within a recess 17 formed in the inner wall of the tilting member 2 at a position opposite to the screw 10, whereby the specimen 7 can be moved vertically along the optical axis Z.

Through rotation of the tilting member 2, the specimen 7 can be tilted with respect to the X-axis because of corresponding rotations of the spherical end portion 3, the supporting sleeve 4 and the specimen holder 5.

Referring to FIG. 1, the movement of the specimen in the X-direction is accomplished through cooperation of a lever 15 having an arm 27 provided with an acting face at a position located adjacent to the free or tip end of the specimen holder 5 in opposition to the latter, and a coupling member 31 interposed between the lever arm 27 and the tip end of the specimen holder 5, wherein the lever arm 27 and the coupling member 31 cooperate to move the specimen holder 5 in the X-direction. The lever 15 is accommodated within a chamber 14 formed integrally with the lens column 1 of the electron microscope and mounted rotatably on a fulcrum pin 24 so that the lever 15 can be rotated in the X-direction about the fulcrum 24. To this end, an adjusting screw 18 and a spring 19 are provided in association with the other arm of the lever 15, as is best seen in FIG. 1.

The coupling member 31 disposed between the lever arm 27 of the lever 15 and the tip end of the specimen holder 5 is in the form of a spherical cone having a sharp apex 32 and a semi-spherical bottom surface 33, wherein the center of curvature of the bottom surface 33 coincides with the apex 32. The curved bottom surface 33 of the coupling member 31 is brought into contact with the acting face of the lever arm 27 at a point while the apex 32 is so positioned as to bear against the tip end of the specimen holder 5 at a point B, so that the bottom surface 33 may roll on the lateral surface of the lever arm 27 upon rotation of the lever 15 around the fulcrum pin 24. The rotation of the lever 15 in turn is accomplished by means of the adjusting screw 18, resulting in that the lever arm 27 is moved toward or away from the tip end of the specimen holder 5. In this manner, the specimen holder 5 can be moved in the X-direction through the medium of the coupling member 33. Reference numerals 25 and 26 denote O-ring seals disposed, respectively, between the lens column 1 and the supporting sleeve 4 and between the specimen holder 5 and the supporting sleeve 4.

With the specimen moving mechanism of the hitherto known structure described above, the smooth swing movement of the specimen holder 5 for moving the specimen in the Y-direction is accomplished by the coupling member 31 interposed between the lever arm 27 and the specimen holder 5 and having a peculiar configuration such that the coupling member 31 is caused to roll along the lateral surface of the lever arm 27 upon rotation or swing of the lever 15.

This structure however involves various problems in conjunction with the planar movement or vertical movement of the specimen 7. By way of example, it is assumed that the adjusting screw 8 is manipulated to cause the specimen 7 to be moved in the Y-direction to the state shown in FIG. 3. The relationships among the specimen holder 5, the lever 15 and the coupling member 31 in the assumed state are illustrated in some exaggeration in FIG. 4 in the form of a schematic diagram. As will be seen in FIG. 4, the specimen holder is rotated for α relative to the center of rotation A in accompaniment to the positional adjustment in the Y-direction, while the coupling member 31 rolls along the lever arm 27 to thereby exert an external force $F_1$ of the horizontal direction from a point C to the center of rotation B located at the tip of the specimen holder 5. This force $F_1$ is angularly deviated from the specimen holder by the angle α, as shown in FIG. 4. As the consequence, when the adjusting screw 18 is advanced in an effort to move the specimen 7 to the right as viewed in FIG. 3, the tip end of the specimen holder 5 is applied with a force of the direction angularly deviated from the center axis by the angle α. Consequently, moment of predetermined magnitude acts on the tip end of the specimen holder due to the rotation of the lever 5 and the pressure exerted by the coupling member 31, resulting in that the specimen holder 5 is flexed or deformed about the fulcrum A. Only after the occurrence of such deformation, the specimen 7 is moved in the X-direction (more strictly in the axial direction of the specimen holder 5). Next, it is assumed that the adjusting screw 18 is withdrawn in an effort to move the specimen 7 to the left as viewed in FIG. 3. Then, deformation of the specimen holder 5 brought about by the aforementioned positional adjustment is first removd, and subsequently the specimen 7 is moved in the direction in which the lever 15 is retracted. In this way, a hysteresis phenomenon takes place when the specimen 7 is caused to move in the X-direction on the X-Y plane. This means that the movement of the specimen 7 in the X-direction as caused by manipulation of the adjusting screw 18 and the lever 15 is necessarily accompanied by the movement of the specimen in the Y-direction, making it imposible to position the specimen with accuracy.

It should further be mentioned that the deformation hysteresis of the specimen holder 5 becomes more significant when the lever 15 is rotated counterclockwise for an angle β in addition to the clockwise rotation of the specimen holder 5 for the angle α relative to the X-axis. In other words, when the specimen holder 5 and the lever 15 are rotated together, an external force $F_2$ urging the specimen holder and thus the specimen 7 to move in the X-direction gives rise to a remarkable angular deviation $\theta$ $(=\alpha+\beta)$, as will be seen in FIG. 5.

SUMMARY OF THE INVENTION

An object of the present invention is to provide a specimen moving or manipulating device for an electron beam apparatus which is capable of moving or positioning a specimen with an improved accuracy.

In view of the above and other objects which will become more apparent as description proceeds, there is provided according to a general aspect of the invention a specimen moving or manipulating apparatus which comprises a specimen holder extending slideably in the direction orthogonal to the electron beam axis and mounted on a lens column or barrel defining an electron beam path rotatably relative to the lens column in a plane orthogonal to the electron beam axis, and a lever mounted on the lens column at a position in the vicinity of the tip of the specimen holder and extending in the direction intersecting the specimen holder, the lever being adapted to move slideably the specimen holder, and a coupling member interposed between the lever member and the specimen holder for rotatable engagement with both of them to thereby operatively coupling together the lever member and the specimen holder. The coupling member has a sharp apex edge and a bottom surface and is so disposed that the apex edge bears against a lateral side of the lever member while the bottom surface is rollingly engaged with the tip end face of the specimen holder. The bottom surface of the rolling coupler is curved or rounded in the direction in which the specimen holder is rotated. On the other hand, the associated end face of the specimen holder may be curved or alternatively formed flatly. The apex edge of the rolling member constituting the coupler may be realized in various sharpened configurations in dependence on modes or fashions in which the specimen holder is rotated swung. By way of example, in the case of such a structure in which the specimen holder is adapted to be rotated only in a plane (horizontal plane) orthogonal to the electron beam axis, the apex of the rolling member may be that of a cone or realized in a wedge-like form. On the other hand, in the case of a structure in which the specimen hoder is adapted to be moved both in a plane orthogonal to the electron beam axis and in a plane extending in the same direction as the electron beam axis, the apex of the rolling member is realized as an apex of a circular cone.

Further, rolling engagement between the coupling member and the specimen holder may be realized in various manners in dependence on the modes or fashions in which the specimen holder is rotated. By way of example, in case the specimen holder is rotated in a plane orthogonal to the electron beam axis in the direction orthogonal to the latter without being accompanied by inclination of the specimen about the X-axis, the bottom surface of the rolling coupler or the curved end face of the specimen holder may be realized in the form of a part of external surface of a spherical or cylindrical body. On the other hand, in case the specimen holder is rotated in a plane orthogonal to the electron beam axis as well as in a plane extending in the same direction as the electron beam axis with inclination about the X-axis, the bottom surface of the rolling coupler and the curved end face of the specimen holder may be realized in the form of a part of the external surface of a spherical body. With the structures according to the invention, deviation produced as the specimen holder is rotated can be significantly reduced when compared with the hitherto known structure described hereinbefore. Further, due to the arrangement that the engaging faces of both the coupling member and the specimen holder are curved, the angular offset or deviation possibly brought about upon rotation of the specimen holder can be reduced down to zero. Accordingly, when the specimen holder is rotated through manipulation of the adjusting screw so that the specimen is moved horizontally, the external force transmitted to the specimen holder through the lever and the coupling member acts always in a predetermined constant linear direction, whereby the tip end portion of the specimen holder is prevented from being flexed, allowing thus the movement of the specimen without being accompanied with the hystereses phenomenon.

The above and other objects, features and advantages of the invention will be more apparent upon consideration of the following description of the preferred embodiments of the invention. The description makes reference to the accompanying drawings.

BRIEF DESCRIPTION OF THE DRAWINGS

FIG. 1 is a horizontal sectional view showing a hitherto known specimen moving device for an electron beam apparatus;

FIG. 2 is a sectional view taken along the line II—II in FIG. 1 for illustrating actuating members for moving a specimen holder horizontally in the hitherto known specimen moving device or apparatus;

FIG. 3 is a view for illustrating operation of the hitherto known specimen moving apparatus;

DESCRIPTION OF THE PREFERRED EMBODIMENTS

Figure 4:
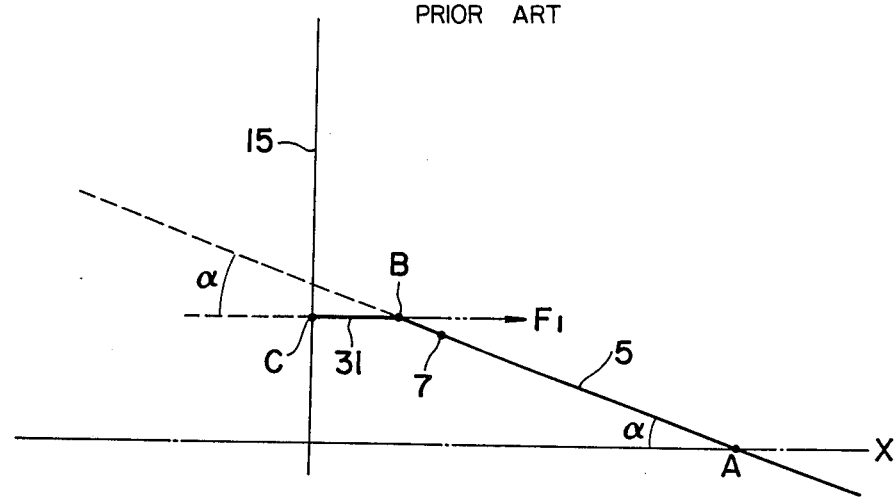
FIG. 4 is a schematic view for illustrating positional relationships among the specimen holder, a coupling member and a lever as well as angular deviations between the specimen holder and the coupling member in some exaggeration in the operating state shown in FIG. 3.
Figure 5:
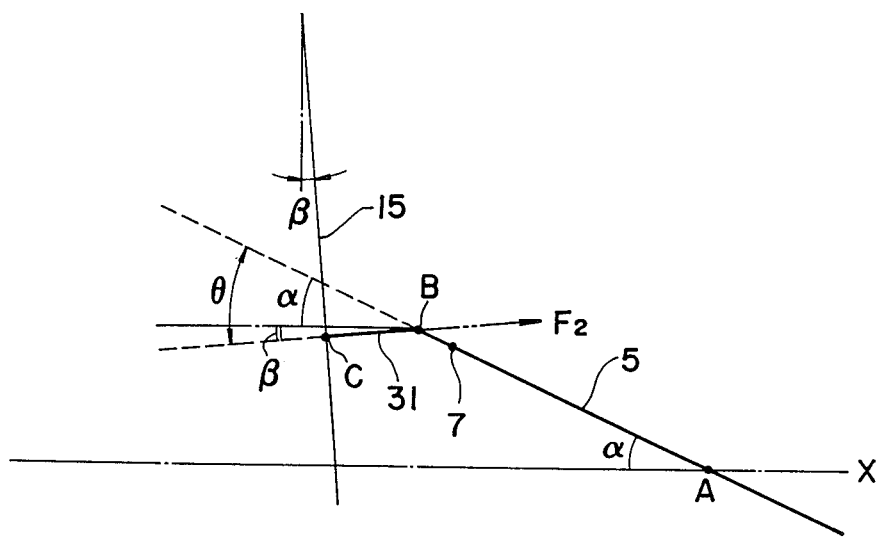
FIG. 5 is a view similar to FIG. 4 and illustrates positional relationships among the specimen holder, the coupling member and the lever as well as angular deviation between the specimen holder and the coupling member in some exaggeration in the assumed state in which rotation of the lever takes place additionally in the operating state shown in FIG. 4.

Now, the invention will be described in detail in conjunction with exemplary embodiments thereof by referring to the drawings.

Figure 6:
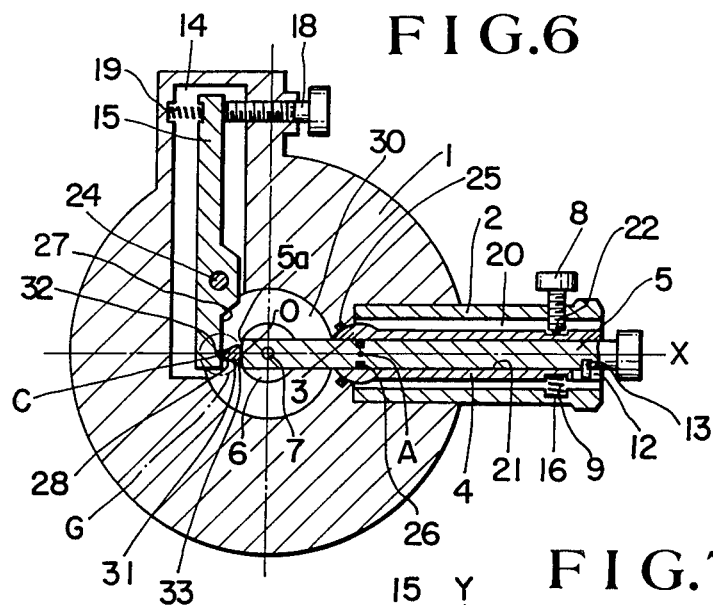
FIG. 6 is a horizontal sectional view showing a specimen moving device for an electron beam apparatus according to a first embodiment of the present invention.
Figure 7:
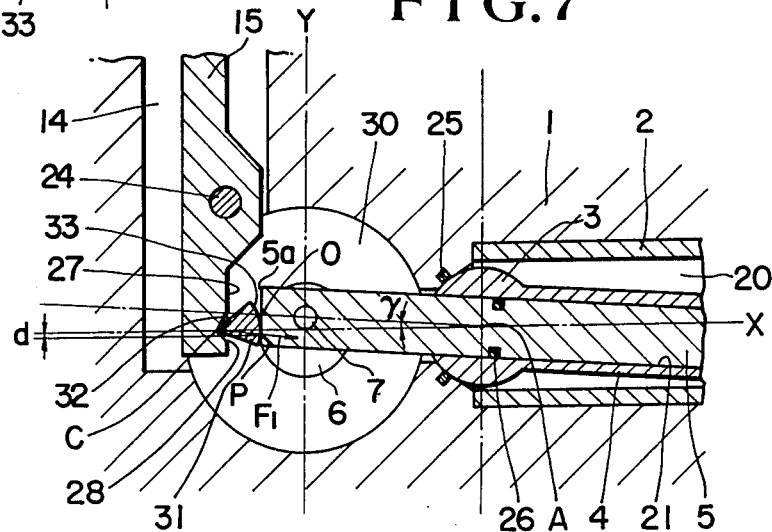
FIG. 7 is a view for illustrating displacements of a specimen holder and a coupling member taking place when a specimen is to be moved horizontally by the specimen moving device according to the first embodiment of the invention.

FIGS. 6 and 7 are views showing a first embodiment of the present invention. Referring to the figures, it will be seen that an edge-like notch 28 is formed in a lateral surface of a lever arm 27 of a lever 15 adapted to move a specimen holder 5 in the X-direction. A coupling member 31 is interposed between the lever member 15 and the specimen holder 5 for operatively coupling or connecting them to each other. The specimen holder 5 has a flat end face 5a which extends in the direction perpendicularly to the X-axis when the center axis of the specimen holder 5 coincides with the X-axis. The coupling member 31 is composed of a rolling element or member having a bottom surface 33 curved arcuately and an apex 32, as in the case of the prior art specimen manipulating device. This rolling member may be cut out from a circular column (or circular cylinder) having a circular section indicated by G in FIG. 6, wherein the bottom 33 is constituted by a part of the external peripheral surface of the circular column with the apex 32 corresponding to the center thereof so that the rolling member is generally in a sector-like form. Alternatively, the rolling member may be constituted by a bottom-rounded circular cone cut out from a spherical body, wherein the bottom 33 of the rolling member is formed by a part of the external surface of the spherical body with the apex 32 corresponding to the center thereof. Thus, the rolling member has the apex 32 which coincides with the center of curvature of the curved bottom surface 33 or the center of the circle G, and is so disposed that the apex 32 engages in the notch 28 of the lever 15 at the deepest location thereof so that the apex 32 constitutes the center of rotation C, while the bottom surface 33 is brought into contact with the tip end face 5a of the specimen holder 5 at a point C. As will now be appreciated, the first embodiment of the present invention differs from the hitherto known structure in that the apex 32 of the rolling element constituting the coupling member 31 engages with the lever 15 while the bottom surface 33 is in engagement with the specimen holder 5.

With the structure of the specimen moving device described above, it is now assumed that the specimen holder 5 is rotated for an angle $\gamma$ about the center of rotation A for moving a specimen 7 in the horizontal direction. In response to this rotation, the coupling member 31 is rotated about the center of rotation C defined by the apex 32, as the result of which the contact point with the specimen holder 5 is displaced from the point O to a point P distanced therefrom only a minute distance d. In this state, a force $F_1$ is applied to the end face 5a of the specimen holder 5 at the point P in the direction perpendicular to the plane of the end face 5a. However, since the point P falls within the diametrial range of the specimen holder 5 (i.e. within the range widthwise of the specimen holder, as viewed in FIG. 7), the force $F_1$ brings about no flexure or deformation of the associated end portion of the specimen holder 5. As a consequence, the specimen 7 can be moved in the horizontal direction with an improved accuracy by correspondingly manipulating the adjusting screw 18 to rotate the lever 15. In other words, deformation of the holder 5 which would otherwise be produced upon movement of the specimen can be suppressed approximately to zero by virtue of the improved mounting arrangement of the coupling member 31 between the specimen holder 5 and the lever 15.

Figure 8:
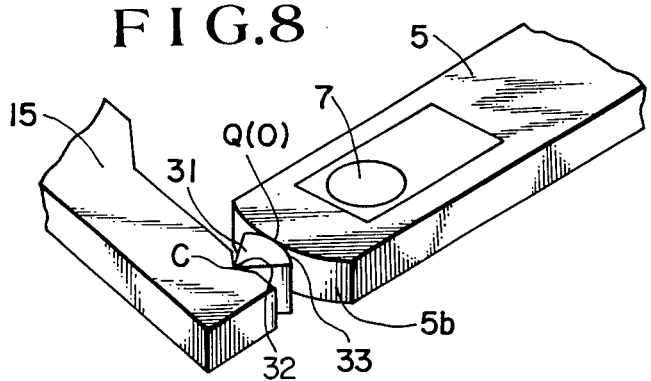
FIG. 8 is a perspective view showing a specimen holder, a coupling member and a lever member employed in a specimen moving device according to a second embodiment of the invention.
Figure 9:
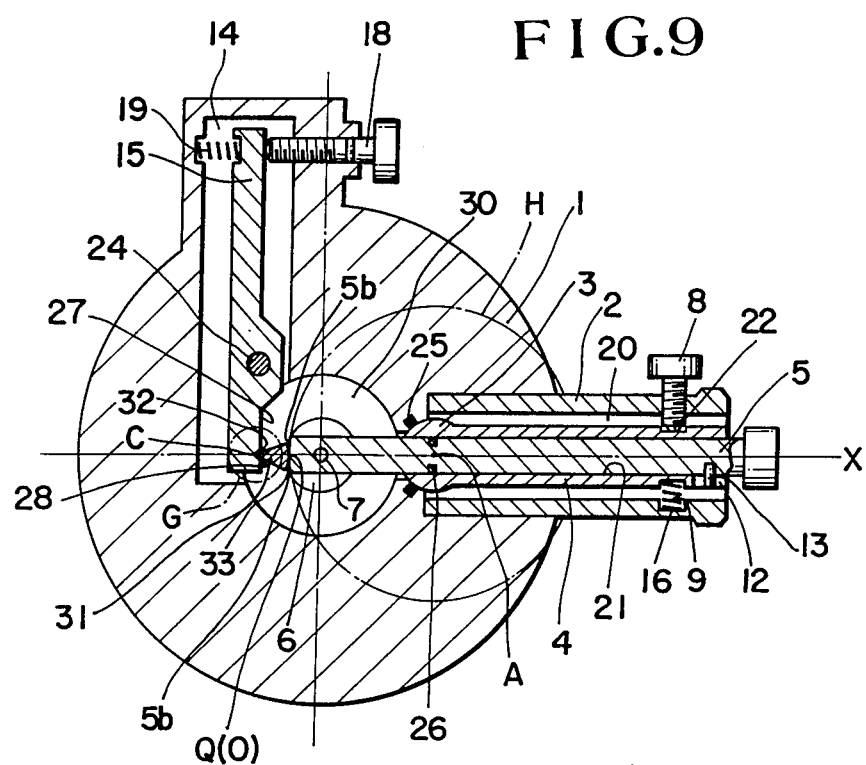
FIG. 9 is a horizontal sectional view showing a structure of the specimen moving device according to the second embodiment of the invention.
Figure 10:
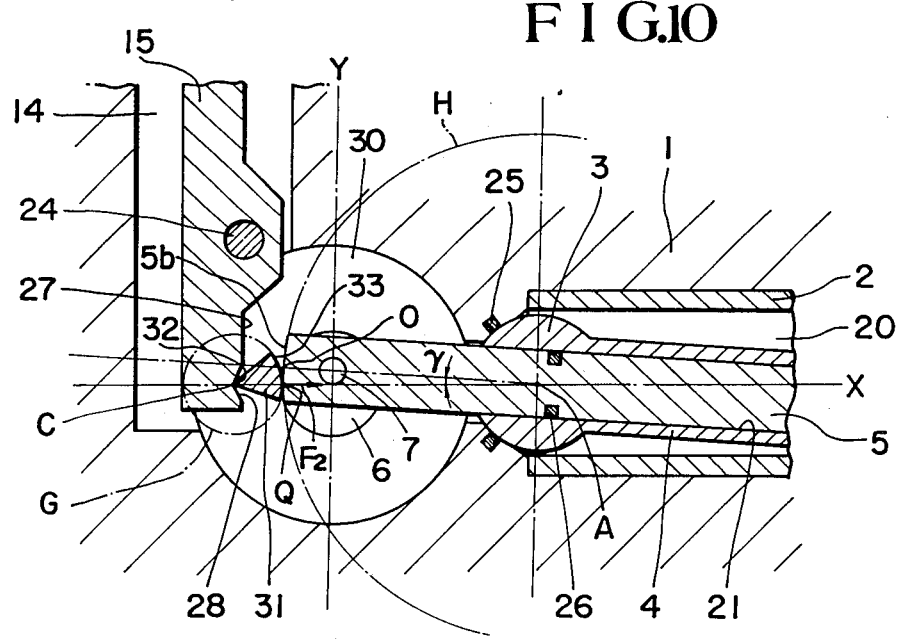
FIG. 10 is an enlarged horizontal sectional view for illustrating operation of the specimen moving device according to the second embodiment.

FIGS. 8 to 10 show a second embodiment of the invention. Referring to the figures, the coupling member 31 constituted by a rolling element and the specimen holder 5 have respective curved surfaces brought into contact with each other to realize a rolling engagement. More specifically, the end face 5b of the specimen holder 5 bulges circularly, as seen in FIG. 8. On the other hand, the coupling member 31 is constituted by a sector-like rolling element having a circularly bulging bottom surface, as is the case of the first embodiment. The circularly bulging end face 5b of the specimen holder engages with the circular bottom surface 33 of the coupling member in circumscription at a point Q (superposed on the point O in the state shown in FIG. 8 and 9). The circularly bulging end face 5b of the specimen holder should preferably be a part of a circle H having a center A, as shown in FIGS. 9 and 10. On the other hand, the bottom surface 33 of the coupling member 31 also should preferably be a part of the circle G having the center C, as is the case of the first embodiment.

In the structure described above, when the specimen holder 5 is rotated at a desired angle about the center of rotation A for moving the specimen 7 in the horizontal direction, the relation between the specimen holder 5 and the coupling member 31 is such as shown in FIG. 10. It will be seen that the specimen holder 5 and the coupling member 31 always contact each other at the point Q lying on the X-axis independent of rotation of the specimen holder about the center of rotation A, whereby the driving force is transmitted from the lever 15 to the specimen holder 5 along the X-axis. Distance between the points O and Q on the specimen holder 5 is much smaller than the distance between the points O and P described above. Further, the force $F_2$ applied at the point Q located within the range widthwise of the holder 5 is directed toward the point A. For these reasons, the specimen is positively protected from flexure and deformation, whereby the movement or positioning of the specimen can be accomplished with much increased accuracy.

Figure 11:
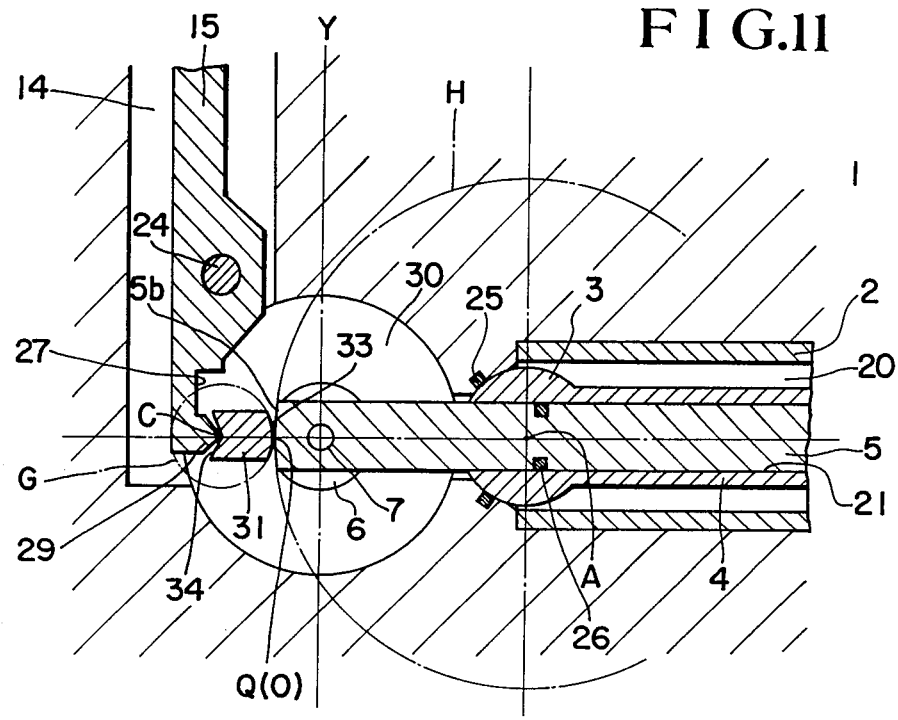
FIG. 11 is a horizontal sectional view showing a version of the second embodiment.

In the case of the first and second embodiments, the lever 15 and the coupling member 31 are pivotally engaged with each other by forming the coupling member in a wedge-like configuration with the notch 28 of the lever being realized in the form of a wedge-like recess. It will however be understood that such pivotal engagement can be reversed, as is shown in FIG. 11. More specifically, referring to FIG. 11, the lever 15 has a wedge-like pointed projection 29 formed in the lateral surface, while a wedge-like recess 34 of the shape corresponding to the projection 29 is formed in the base end portion of the coupling member 31, whereby the pivotal coupling is realized between the lever 15 and the coupling member 3. On the other hand, the engaging portions of the specimen holder 5 and the coupling member 31 have respective circularly buldging surfaces at which they engage with each other.

As will now be understood, the movement of the specimen in the horizontal direction can be accomplished very accurately by realizing the mutually engaging portions of the coupling member and the specimen holder 5 in a circularly and outwardly curved form. This concept can of course be applied to the mechanism for moving the specimen in the vertical direction. To this end, the opposing end faces of the coupling member and the specimen holder should prefereably be realized each in the form of a semi-spherical shape. Then, the specimen holder 5 and the coupling member 31 can be brought into contact with each other always at the point Q lying on the X-axis independent of whether the specimen holder 5 is rotated horizontally or vertically about the center of rotation A. As the consequence, the coupling member 31 can be maintained in the stationary state even when the specimen holder 5 is rotated by correspondingly rotating the tilting member 2 so as to tilt the specimen with respect to the optical axis Z. In case the semi-spherical end face is adopted, the coupling member 31 may be constituted by the circular cone described hereinbefore, while the notch 28 is formed in a circular cone-like configuration so as to accommodate the apex 32 of the coupling member 31. Further, the projection 29 (FIG. 11) may be formed in a circular cone, while the corresponding end face of the coupling member 31 may be formed with a bearing recess 34 having a configuration of a circular cone.

Figure 12:
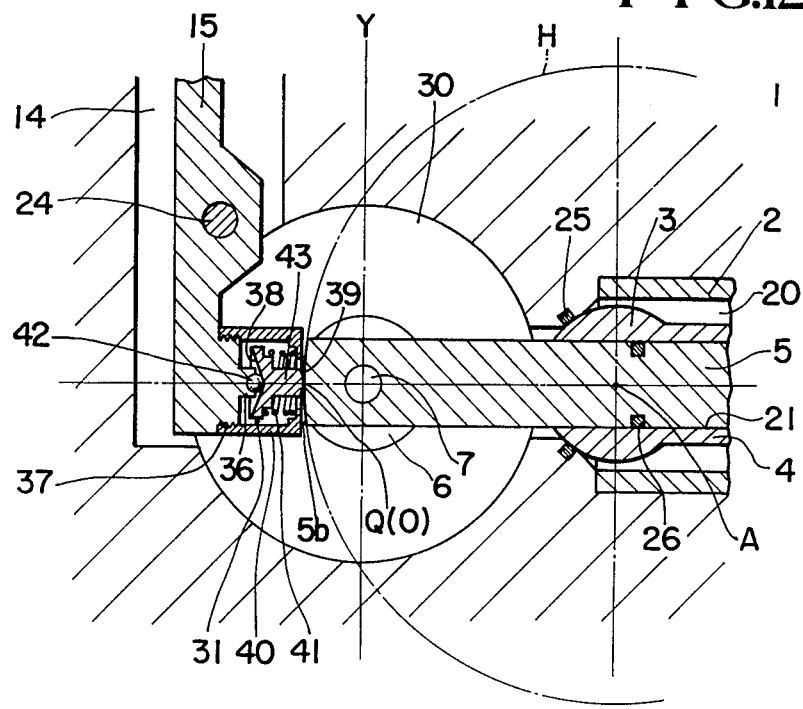
FIG. 12 is a horizontal sectional view of a specimen moving device according to a third embodiment of the invention in which a coupling member is mounted on the lever member.

Other configurations of the coupling member 31 interposed between the lever 15 and the specimen holder 5 are possible. FIG. 12 shows a third embodiment of the invention in which a version of the coupling member 31 is employed. Referring to FIG. 12, the lever 15 has a lateral side provided with a projection 36 threaded as indicated at 37. The coupling member 31 is composed of a conical bearing recess 38 formed in the base end portion and flaring outwardly, and a stud 43 extending from the top of the bearing portion 38 and having a semi-spherical free end face 39. The bearing recess 38 receives a projection 36 formed in the protruding portion of the lever 15 with a ball 42 being interposed between the bearing recess 38 and the projection 36. A compression spring 41 is disposed around the stud 43. The assembly including the coupling member 31, the spring 41 and the ball 42 is fixely held in place by a cover 40 threadedly fitted on the protrusion 37. The specimen holder 5 has a semi-spherical end face 5b having the center of curvature A, which end face 5b is brought into contact with the similar end face 39 of the stud 41. When the lever 15 is rotated, the semi-spherical end face 39 of the coupling member 31 rolls on the semi-circular end face 5b of the specimen holder 5, while smooth relative movement between the coupling member 31 and the lever 15 can be assured by virtue of the provision of the interposed ball 42.

Due to the structure of the coupling member 31 which includes the conical bearing recess 38 and the stud 43, the center of gravity of the coupling member 31 is located in the vicinity of the contacting point between the coupling member 31 and the ball 42. Thus, the center of rotation of the coupling member 31 relative to the lever 15 coincides with the center of gravity of the coupling member 31. With this structure, the coupling member 31 is subjected to moment due to the weight of the coupling member 31, whereby rigidity in appearance of the member 31 is increased significantly. Thus, the structure shown in FIG. 12 exhibits high resistance to vibration and hence insusceptibility to the influence of external vibration.

As will be appreciated from the foregoing description, the structures of the specimen moving apparatus according to the invention in which the coupling member composed of a rolling element is interposed between the tip end of the specimen holder and the lateral face of the lever extending in the direction orthogonal to the axis of the specimen holder and in which the coupling member is in pivotal engagement with the lever and in rolling engagement with the tip end face of the specimen holder, the specimen can be effectively prevented from drifts under the influence of thermal expansion and contraction of the elements constituting the specimen moving device or apparatus due to changes in the ambient temperature, while the bending moment otherwise applied to the specimen holder your movement of the specimen in the horizontal direction can be reduced approximately to zero. Thus, the horizontal movement and positioning of the specimen can be accomplished with a significantly enhanced accuracy. Further, since the coupling member can be constituted by a rolling element of a very small size, the weight of the coupling member itself exerts no adverse influence. Additionally, moment due to the weight of the rolling member can be suppressed to a possible minimum, while the center of rotation of the coupling member can be made to coincide with the center of gravity, which in turn means that the vibration withstanding capability of the specimen moving positioning apparatus can be significantly enhanced.

What is claimed is:

1. A specimen moving apparatus for an electron beam apparatus comprising:
   a specimen holder mounted on a lens column defining an electron beam axis, said specimen holder extending slideably in a direction orthogonal to the electron beam axis and being mounted rotatably in a direction substantially orthogonal to the electron beam axis, said specimen holder having an outwardly curved end face;
   a lever member disposed in the vicinity of a distal end of said specimen holder in a direction perpendicular to said specimen holder for slideably moving said holder; and
   a coupling member interposed between said lever member and said specimen holder for operatively interconnecting said lever member and said specimen holder;
   said coupling member having an apex and a bottom surface, said apex engaging a notch provided on a lateral portion of said lever member and said bottom surface being curved about said apex and rollingly engaging said end face of said specimen holder.

2. A specimen moving apparatus according to claim 1 wherein;
   the center of curvature of said curved end face of said specimen holder coincides with the center of rotation of said specimen holder.

3. A specimen moving apparatus according to claim 1 wherein;
   said curved end of said specimen holder is of a spherical configuration the center of which coincides with the center of rotation of said specimen holder.

* * * * *